United States Patent [19]

Sakai

[11] Patent Number: 5,070,375
[45] Date of Patent: Dec. 3, 1991

[54] SEMICONDUCTOR DEVICE HAVING A COUPLED QUANTUM BOX ARRAY STRUCTURE

[75] Inventor: Hiroyuki Sakai, Yokohama, Japan

[73] Assignee: Research Development Corporation of Japan, Tokyo, Japan

[21] Appl. No.: 437,571

[22] Filed: Nov. 17, 1989

[30] Foreign Application Priority Data

Nov. 19, 1988 [JP] Japan .................. 63-293336

[51] Int. Cl.$^5$ ........................... H01L 27/12
[52] U.S. Cl. ........................... 357/4; 357/16; 357/55; 357/30
[58] Field of Search ............ 357/4, 16, 55, 30 E

[56] References Cited

U.S. PATENT DOCUMENTS 4,751,194 6/1988 Cibert et al. ............ 357/4 X

OTHER PUBLICATIONS

Arakawa, "Quantum Well Laser-Gain, Spectra, Dynamics", *IEEE Journal of Quantum Electronics*, vol. QE-22, No. 9, Sep. 1986, pp. 1887-1987.
Sakaki, "Scattering Supression and High-Mobility Effect of Size-Quantized Electrons in Ultrafine Semiconductor Wire Structures", *Japanese Journal of Applied Physics*, vol. 19, No. 12, Dec. 1980, pp. L735-L738.
Sakai et al., "Possible Applications of Surface-Corrugated Quantum Thin Films to Negative-Resistance Devices", *Thin Solid Films*, 36(1976), 497-501.
Arakawa et al., "Multidimensional Quantum Well Laser and Temperature Dependence of its Threshold Current", *Appl. Phys. Lett.*, 40(11), Jun. 1982, pp. 939-941.
"Mobility of the Two-Dimensional Electron Gas at Selectively Doped n-type $Al_xGa_{1-x}As/GaAs$ Heterojunctions with Controlled Electron Concentrations", Hirakawa et al., *Physical Review B Condensed Matter*, vol. 33, Third Series, No. 12-I, Jun. 15, 1986, pp. 8291-8303.
"Possible Applications for Surface-Corrugated Quantum Thin Film to Negative-Resistance Devices", Sakaki et al., Thin Solid Films, 36, (1976), pp. 497-501.
"Scattering Suppression and High-Mobility Effect of Size-Quantized Electrons in Ultrafine Semi-Conductor Wire Structures", Sakai, Japanese Journal of Applied Physics, vol. 19, No. 12, Dec., 1980, pp. L735-L738.
"Multidimensional Quatnum Well Laser and Temperature Dependance of Its Threshold Current", Arakawa et al., Applied Physics Letter, vol. 40, No. 11, Jun. 1, 1982, pp. 939-941.
"Quantum Wire Superlattices and Coupled Quantum Box Arrays; A Novel Method to Supress Optical Phonon Scattering in Semiconductors", Sakaki, Japanese Journal of Applied Physics, vol. 28, No. 2, Feb., 1989, pp. L314-L316.

*Primary Examiner*—William Mintel
*Attorney, Agent, or Firm*—Armstrong, Nikaido, Marmelstein, Kubovcik & Murray

[57] ABSTRACT

The present invention teaches a semiconductor having a quantum box structure, where the quantum box structure consists of quantum boxes and barriers and arranged in adjacent positions. By combining the quantum boxes with the barriers, electrons are confined by a quantum within the quantum effects box structure, and an electron state having a miniband with finite width and gap with finite width is generated so that the electrons can move between quantum box structures by a tunnel effect. It is characterized in that the width of the miniband is smaller than the intrinsic energy of a phonon, that the gap between the miniband generated from the lower energy level and the miniband generated from the next lowest energy level is bigger than said intrinsic energy, and that most of the electrons are in the miniband state generated from the lowest energy level. This makes it possible to suppress the lattice vibration by confining the electrons within the quantum boxes while enabling electric conduction and to improve the dependency of electron mobility on temperature in the semiconductor.

6 Claims, 4 Drawing Sheets

FIG. 2
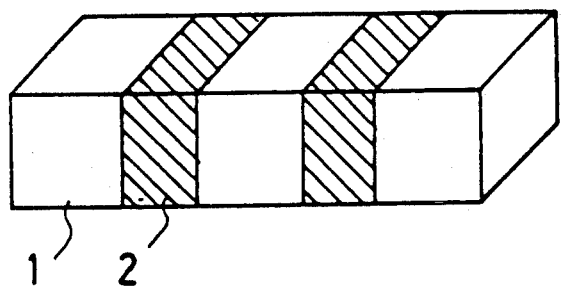
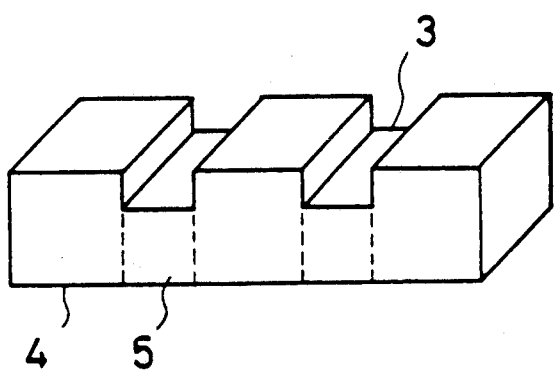
FIG.4(a)
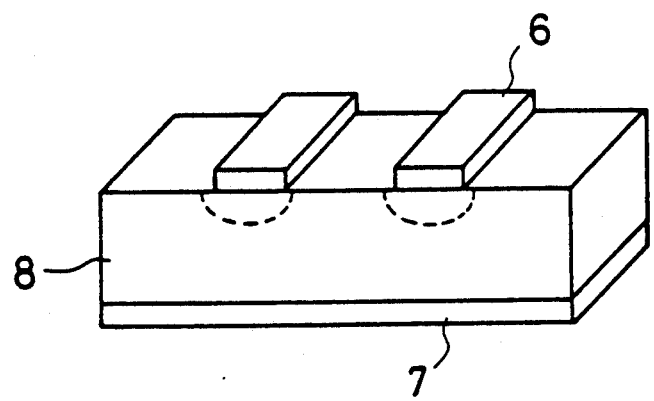
FIG.4(b)
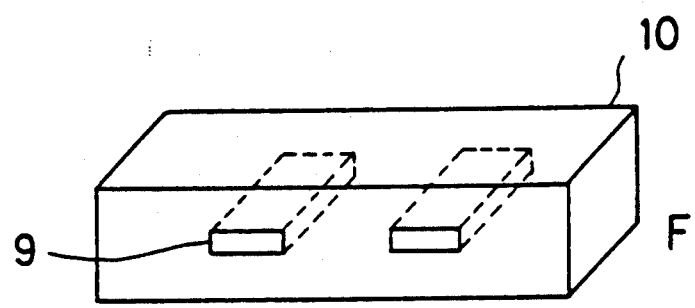
FIG.4(c)

SEMICONDUCTOR DEVICE HAVING A COUPLED QUANTUM BOX ARRAY STRUCTURE

BACKGROUND OF THE INVENTION

The present invention relates to a semiconductor having a coupled quantum box array structure to suppress optical phonon scattering by incorporating an artificial structure in a semiconductor.

The electrons in a semiconductor material contribute to electric conduction and are utilized in transistors, for example. The electrons are scattered in a disturbed portion of the crystal and frequently change their directions. Therefore, when an electric field F is applied, the velocity v of the electron flow is not increased simply with the time elapsed, but it flows at a constant velocity determined by $\mu \times F$. Here, $\mu$ is a physical quantity called the electron mobility and is proportional to a mean time interval T of the scattering.

FIG. 1 shows the dependency of electron mobility on temperature in the case of an n-type AlGaAs/GaAs hetero junction. As shown in FIG. 1 (See Physical Review, B condensed Matter, Volume 33, Third Series, Number 12-I, p. 82-97, FIG. 5.), the electron mobility $\mu$ rapidly decreases when temperature rises, and the decrease becomes very conspicuous when its temperature increases to 100° K. or more. Namely, when the temperature including room temperature exceeds 100° K., thermal vibration (called phonon or lattice vibration) occurs, in which the crystal lattice of the atom groups constituting the crystal lattice is vibrated, whereas it is known that the main cause of the above scattering is the slight disturbance of the lattice arrays caused by thermal vibration. The electron mobility is determined by this thermal vibration.

Particularly, in a polar semiconductor such as GaAs, a lattice vibration called optical phonon controls the scattering, and this determines the characteristics of semiconductor devices such as FETs.

In the past, it has been believed that the dependency of electric resistance on the temperature in semiconductors or metal was caused by the influence of the lattice vibrations on the electrons and that it is unavoidable for the electrons to be placed under the influence of lattice vibration. Accordingly, it is considered essential to cool the semiconductor in order to eliminate the scattering, and the decline of the undesirable electrical characteristics in a semiconductor material due to a temperature rise of the semiconductor material could be suppressed by cooling.

SUMMARY OF THE INVENTION

It is an object of the present invention to suppress the optical phonon scattering, believed to be unavoidable in the past, by incorporating an artificial structure in semiconductor. Another object of this invention is to provide a semiconductor material having a quantum structure, in which the dependency of the electrical properties of a semiconductor material on temperature has been improved.

To attain the above objects, the present invention provide a semiconductor material having a quantum box array structure including quantum box arrays arranged at adjacent positions, characterized in that the electrons are confined in the quantum box structure and an electron state having a miniband with a finite width and a gap with a finite width is created in such manner that the electrons can move between the quantum box structures through the quantum tunneling effect, in which the width of the miniband is smaller than the intrinsic energy of a phonon and in which the gap between the miniband generated from the lowest energy level and that of the next lowest energy level is bigger than said intrinsic energy, and in which most of the electrons are in the miniband state generated from the lowest energy level.

By providing the above state, in which the width of the miniband and the width of the gap are in a specific relationship with the electron state and the electrons can move between the quantum box structures by the quantum tunnel effect, it is possible to confine the electrons in the quantum box while enabling the electric conduction and suppressing the lattice vibration. Thus, the dependency of the electron mobility in a semiconductor material on temperature can be improved.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 2 shows an embodiment of the semiconductor having a coupled quantum box array structure according to the invention;

FIGS. 4(a) to 4(c) show other embodiments of the semiconductor having a coupled quantum box array structure according to the invention;

DETAILED DESCRIPTION OF THE PREFERRED EMBODIMENTS

Figure 1:
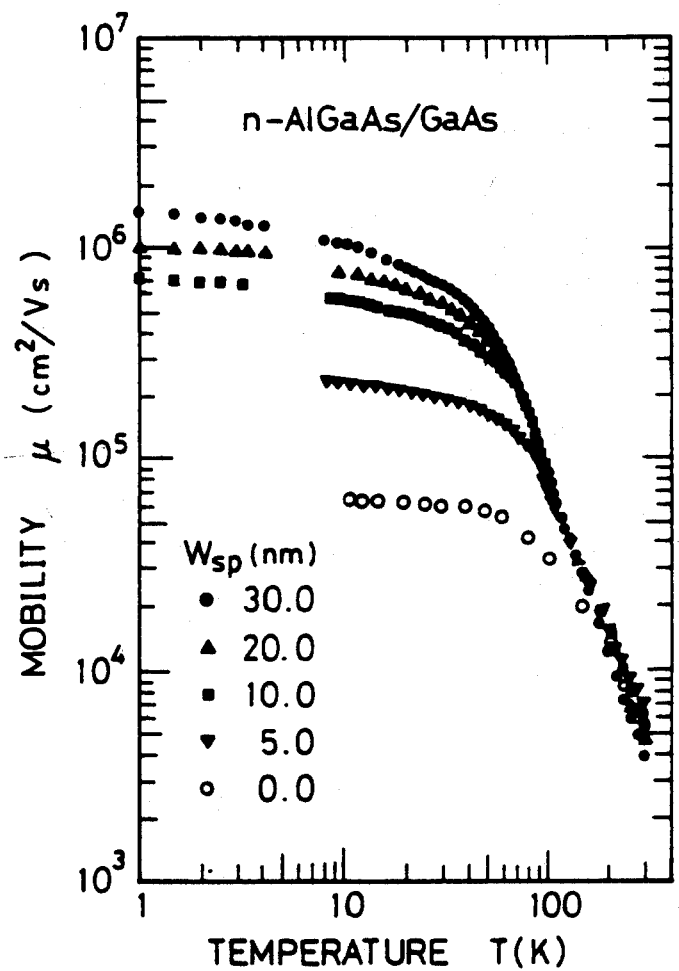
FIG. 1 is a diagram showing the dependency of electron mobility on temperature in an n-type AlGaAs/GaAs hetero junction.

In the following, a description is given on embodiments of the invention which are illustrated in the drawings.

Semiconductor devices according to the invention use a thin film growth technique such as a molecular beam epitaxy method, a organic metal CVD method, etc., elements being formed using a quantum thin film such as a quantum well laser, a quantum wire laser, a quantum box laser, etc. have been proposed (e.g. "Applied Physics", Volume 40, No. 10, (1982), pp. 939-941). In these devices, the electrons are confined in a thickness direction by providing a active layer as a quantum thin film with the same thickness (approx. 100 Å) as the wavelength of the de Broglie wave of an electron so that the electrons can behave as free particles only in a 2-dimensional direction along the thin film.

The present invention uses the quantum box, in which the lateral dimension of the above quantum thin film is reduced, as a basic structure. In the example of the semiconductor having the coupled quantum box array structure as shown in FIG. 2, quantum boxes 1 are aligned at adjacent positions with barriers 2 of a different material therebetween. By providing such a structure and satisfying a certain condition, the phonon scattering is suppressed in quantum boxes, and the electrons can move between the quantum boxes 1 through the barriers 2 by the quantum tunnel effect. The conditions for this are: (1) By the quantum tunnel effect between the quantum boxes, the energy level is extended to a certain extent (i.e., a miniband), whereas the width $E_b$ of the miniband is smaller than the intrinsic energy $E_{OP}$ of a phonon; (2) The gap $E_g$ between the miniband generated from the lowest energy level and the miniband generated from the next lowest energy level is bigger than the intrinsic energy $E_{OP}$; (3) Most of the electrons are in the state of the lowest miniband.

In the following, the behavior of the semiconductor having the coupled quantum box array structure is described.

In the scattering of electrons by an optical phonon, the intrinsic energy $E_{OP}$ of a phonon is absorbed or released, and the electron energy E is increased or decreased by the intrinsic energy $E_{OP}$. Namely, when lattice vibration is generated by giving (releasing) energy through the collision of electrons caused by scattering, the energy of the electrons is changed to $E - E_{OP}$. On the contrary, if energy is absorbed, it is changed to $E + E_{OP}$. Incidentally, the energy $E_{OP}$ is about 30 meV, and this value approximately corresponds to thermal energy when the electrons are moving. Therefore, if the giving and the taking of the energy are stopped, the phonon scattering can be suppressed.

Figure 3:
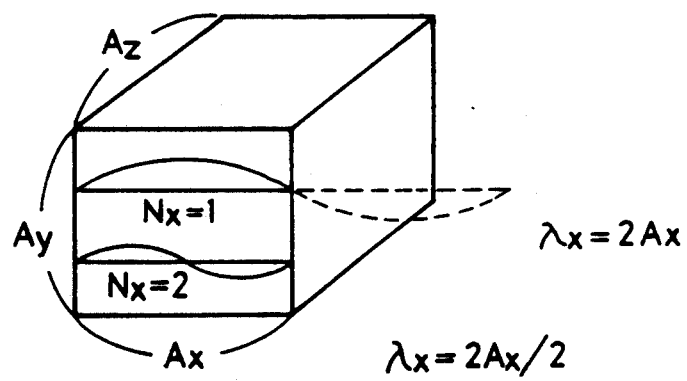
FIG. 3 is a drawing to illustrate a standing wave in the quantum box.

Suppose that there is a quantum box having the dimensions $A_x$, $A_y$ and $A_z$ along the axes X, Y and Z as shown in FIG. 3. If $A_x > A_y > A_z$, the standing waves of the electrons are generated when the electrons are confined in the boxes. As a result, the wavelength λ is allowed to have only an intermittent value corresponding to the number of the peaks of the standing wave. For example, it is:

$$\lambda_x = 2A_x / N_x$$

in the "x" direction. Here, $N_x$ is the number of quanta (i.e. the number of the peaks of the standing wave as shown in FIG. 3) and it is an integral number (1, 2, 3, . . . ). The same applies to the "y" direction and the "z" direction.

If the momentum $P_x$ of the electron has a Planck constant h, $$P_x = h / \lambda_x$$

Therefore, the energy E is expressed by:

$$\begin{aligned} E\ (N_x, N_y, N_z) &= (1/2\ m)(P_x^2 + P_y^2 + P_z^2) \\ &= \left(\frac{h^2}{2m}\right)\left\{\left(\frac{N_x}{2A_x}\right)^2 + \left(\frac{N_y}{2A_y}\right)^2 + \left(\frac{N_z}{2A_z}\right)^2\right\} \end{aligned}$$

That is, it is obtained by dividing the square of the momentum by 2 m (m: Mass). Since the numbers of quanta $N_x$, $N_y$ and $N_z$ are integral numbers, the energy E has intermittent or discontinuous values.

Accordingly, the electron has the lowest quantum energy when there is one peak of the standing wave in each direction. That is:

E(1, 1, 1).

The next lowest energy status occurs when one of $N_x$, $N_y$ and $N_z$ becomes equal to 2. If $A_x > A_y > A_z$ in this case,

E(2, 1, 1).

When the electrons are in the lowest quantum energy state and the gap $E_g$ to the next lowest energy status is bigger than the optical phonon energy $E_{OP}$, the movement between quantum state by a phonon is suppressed. However, since the electrons in the quantum boxes cannot move, there is no contribution to electrical conduction.

If only $A_x$ is extended, the quantum wire is generated, and this enables the conduction in the "x" direction. However, if $A_x$ is extended too much, the energy gap in the states:

$$N_x = 1, 2, 3, \ldots$$

is extremely decreased. Thus, the discrete property of energy is lost and a quasi-continuous energy state is allowed, making the suppression of phonon scattering impossible. To overcome this dilemma, it is preferable to use the intermediate structure between a quantum box and a quantum wire (i.e. a coupled quantum box array structure). Specifically, it is proposed to use a structure, in which the quantum boxes are aligned at adjacent positions and the electrons can move between them by a quantum tunneling effect, i.e. the use of a quantum wire superlattice is preferable. However, the energy state allowed in this case must satisfy the conditions as described above. That is: (1) By the tunnel effect between the quantum boxes, the energy level is extended to a certain extent (miniband), whereas the width $E_b$ of miniband is smaller than $E_{OP}$.

Namely, if the width $E_b$ of the miniband is smaller than $E_{OP}$, it cannot be turned to the state where $E_{OP}$ is absorbed or released by lattice vibration; (2) The $E_g$ between the miniband generated from the lowest energy level and the miniband generated from the next lowest energy level is bigger than $E_{OP}$.

Namely, in the case where there is a miniband generated from the lowest energy level with only one peak of the standing wave and the miniband generated from the next lowest energy level with two peaks in one direction, it is not possible to move to the other miniband by changing the shape of the peak even when $E_{OP}$ is absorbed or released by lattice vibration if the gap $E_g$ is bigger than $E_{OP}$. (3) Most of the electrons are in the state of the lowest miniband.

Under these conditions, it is possible to generate the state, which contributes to electrical conduction but does not receive lattice vibration.

FIG. 4 shows another embodiment of the semiconductor having a coupled quantum box array structure of the present invention, where 3 represents a groove, 4 a quantum box, 5 a barrier, 6 and 7 control electrodes, 8 and 10 quantum wires, and 9 a control electrode.

In the examples shown in FIG. 4(a), a groove 3 is provided instead of the barrier of FIG. 2, and this forms a barrier 5 to hinder the passage of electrons, and the quantum boxes 4 and the barriers 5 are arranged one after another. That is, the film thickness is controlled. In the example shown in FIG. 4(b), a control electrode 6 is placed on the quantum thin film 8 to form the layer, which hinders the passage of the electrons. In the example of FIG. 4(c), a different material or a control electrode 9 is arranged in the quantum thin film 10.

As it is evident from the embodiments as described above, the semiconductor with the coupled quantum box array structure of the present invention has 1 structure that such the layers allowing easier existence of the electrons as standing waves are arranged at adjacent positions to the layers hindering the passage of the electrons. Therefore, it can have the structure which includes quantum boxes and barriers as shown in FIG. 2 or the structure as shown in FIG. 4, and further, it can have other structures equivalent to these.

There have been various proposals to prepare the quantum structure. In the following, description will be given to a part of a separate application by the present inventor (Japanese Patent Application Sho 63-168068).

Figure 6:
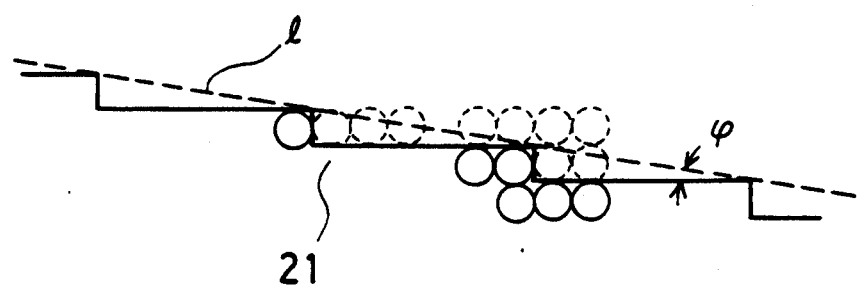
FIG. 6 illustrates method for preparing a periodic step structure.

In FIG. 6, the substrate 21 denotes a crystal of GaAs. When this is polished at a specific angle $\phi$ from a specific orientation of the crystal, the periodic step structure as shown is obtained. If this is composed of atoms represented by the symbol the atom layers consisting of o, the atoms of o shown by dotted lines are scraped off by polishing, and a step structure corresponding to an thickness of the atom layer can be formed. Namely, because an atom cannot be polished partially, the portion partially involved in polishing (atoms o shown by dotted lines) is scraped off, and a graded step occurs according to each atom. Therefore, the step width varies according to the polishing angle. It is narrowed down as the angle $\phi$ increases, and it is widened as the angle decreases. For example, with the angle $\phi$ and the step width $\Lambda$, the following relationship is obtained.

| $\phi$ (°) | 0.5 | 0.8 | 1 | 1.6 | 2 |
|---|---|---|---|---|---|
| $\Lambda$ (Å) | 320 | 200 | 160 | 100 | 80 |

Figure 5:
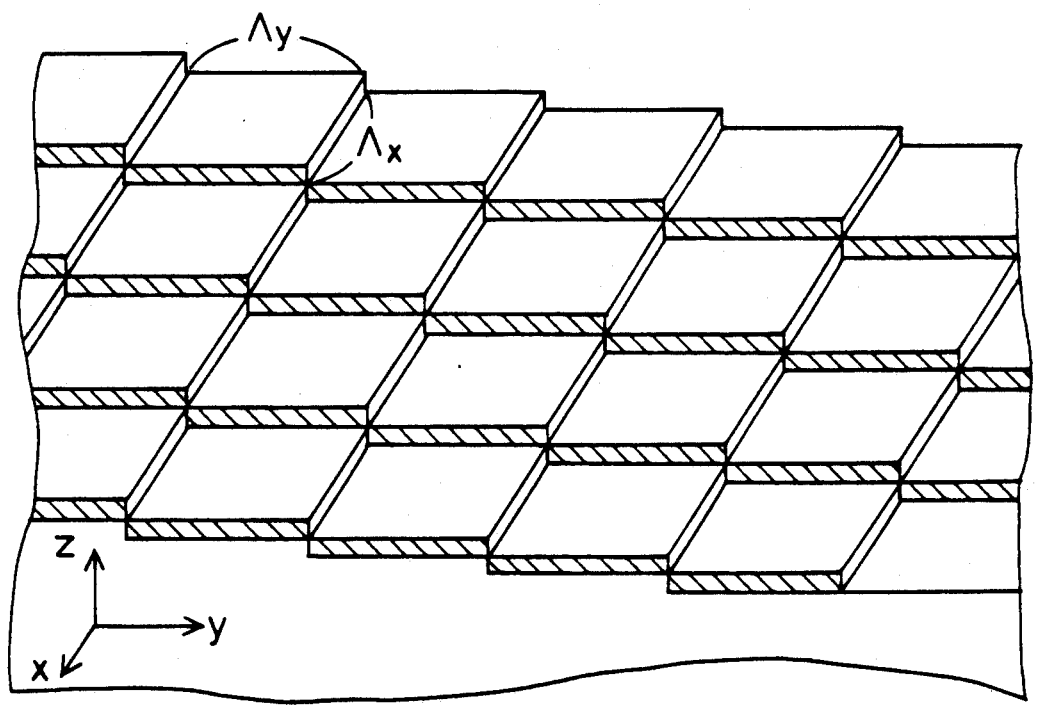
FIG. 5 illustrates an example of a 2-dimensional step structure.

Also, it is possible to form the 2-dimensional step structure as shown in FIG. 5 according to the polishing direction.

Figure 7:
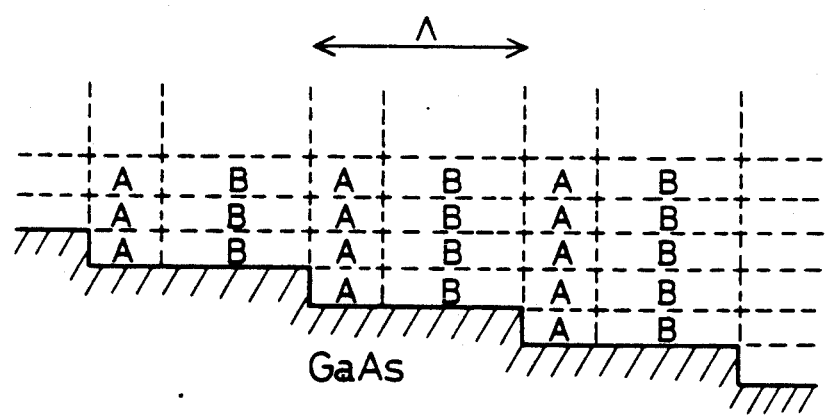
FIG. 7 is a drawing to explain the method to prepare the quantum well device using the crystal growth method.

When the materials A and B are deposited as shown in FIG. 7 on the substrate 21 thus prepared, the crystal with different compositions in longitudinal direction can be formed (e.g., "Applied Physics Letters" Volume 45 (1984), pp. 620-622). Specifically, when the material A is deposited for the thickness of several atoms, a junction occurs on two faces of the bottom and the side at the corner of the step, and the crystal is formed sequentially from this corner. Accordingly, by inserting and depositing the material A, it is possible to form the structure as shown in FIG. 3 (c).

The present invention is not limited to the above embodiments, and it is possible to conceive various variations. For example, description was given in the above on the structure where quantum boxes are aligned to a 1-dimensional direction, whereas the quantum boxes may be aligned within a plane or stereoscopically as far as the above conditions are met.

As it is evident from the above description, it is possible by the present invention to suppress the phonon scattering without losing the discrete property of energy, to suppress the optical phonon scattering, believed to be unavoidable in the past, because the intermediate structure between a quantum box and quantum wire (a coupled quantum box array structure) contributing to electric conduction is used, and to extensively improve the dependency of electron mobility on temperature in the semiconductor.

What we claim is:

1. A semiconductor device having a coupled quantum box array structure, comprising a plurality of quantum boxes alternatingly arranged with a plurality of barriers, in which electronic states have energy minibands of finite width and energy gaps of finite width, each potential of said barriers being sufficiently high to confine electrons within respective ones of said plurality of quantum boxes, and each width of said barriers being sufficiently small to permit electrons to move between said quantum box through corresponding ones of said barriers by quantum tunneling.

2. A semiconductor device having a coupled quantum box array structure as set forth in claim 1, wherein the width of said energy miniband is smaller than an intrinsic phonon energy, the width of said energy gap between a lowest energy miniband and a next lowest energy miniband is greater than said intrinsic phonon energy level, and most electrons in respective ones of said quantum boxes are in said lowest energy miniband.

3. A semiconductor device having a coupled quantum box array structure as set forth in claim 1, comprising a thin film which has a thickness comparable to a quantum wavelength of electrons, and further comprising a plurality of grooves on said thin film to produce potentials serving as said barriers.

4. A semiconductor device having a coupled quantum box array structure as set forth in claim 1, comprising a thin film which has a thickness comparable to a quantum wavelength of electrons, and further comprising a plurality of control electrodes disposed on said thin film to produce potentials serving as said barriers.

5. A semiconductor device having a coupled quantum box array structure as set forth in claim 1, comprising a thin film which has a thickness comparable to a quantum wavelength of electrons, and further comprising a plurality of semiconductor layers inserted in said thin film to produce potentials serving as said barriers, wherein said semiconductor layers are composed of a different material from that of said thin film.

6. A semiconductor device having a coupled quantum box array structure as set forth in claim 2, comprising a thin film which has a thickness comparable to a quantum wavelength of electrons, and further comprising a plurality of control electrodes inserted in said thin film to produce potentials serving as said barriers.

* * * * *

UNITED STATES PATENT AND TRADEMARK OFFICE
CERTIFICATE OF CORRECTION

PATENT NO. : 5,070,375

DATED : December 3, 1991

INVENTOR(S) : Hiroyuki Sakaki

It is certified that error appears in the above-identified patent and that said Letters Patent is hereby corrected as shown below:

On the cover page, Item [75], "Hiroyuki Sakai" should read --Hiroyuki Sakaki--.

Signed and Sealed this

Twenty-third Day of March, 1993

Attest:

STEPHEN G. KUNIN

Attesting Officer

Acting Commissioner of Patents and Trademarks

UNITED STATES PATENT AND TRADEMARK OFFICE
CERTIFICATE OF CORRECTION

PATENT NO. : 5,070,375
DATED : December 31, 1991
INVENTOR(S) : Hiroyuki Sakaki

It is certified that error appears in the above-indentified patent and that said Letters Patent is hereby corrected as shown below:

On the cover page, Item [56], under Other Publications, line line 8, "Sakai et al" should read -- Sakaki et al --.

On the cover page, Item [57], line 6, after "quantum", insert -- effect --;

line 6, delete "effects".

Column 2, line 59, "Physics", Volume 40, No. 10," should read -- Physics Letters", Volume 40, No. 11, --.

Signed and Sealed this

Eighth Day of June, 1993

Attest:

MICHAEL K. KIRK

Attesting Officer

Acting Commissioner of Patents and Trademarks